(12) United States Patent
Lei

(10) Patent No.: US 6,781,836 B1
(45) Date of Patent: Aug. 24, 2004

(54) MICROPROCESSOR-HEAT SLUG FASTENING FRAME

(75) Inventor: Pei Chih Lei, Taipei (TW)

(73) Assignee: Cooler Master Co., Ltd., Taipei (TW)

( * ) Notice: Subject to any disclaimer, the term of this patent is extended or adjusted under 35 U.S.C. 154(b) by 134 days.

(21) Appl. No.: 10/171,792

(22) Filed: Jun. 17, 2002

(51) Int. Cl.[7] .................................................. H05K 7/20
(52) U.S. Cl. ........................ 361/703; 24/458; 248/510; 257/719
(58) Field of Search ................................ 361/703–705, 361/709–712, 717–719, 722; 24/453, 457, 458; 248/505, 510; 257/718, 719, 726, 727; 165/80.3, 185; 174/16, 3

(56) References Cited

U.S. PATENT DOCUMENTS 6,462,945 B2 * 10/2002 Sloan et al. ................ 361/687
6,480,384 B2 * 11/2002 Lo .............................. 361/704

OTHER PUBLICATIONS

USPGPUB, 2002/0159234 A1, filed May 11, 2001, Chen.*
USPGPUB, 2001/0002160 A1, filed Dec. 14, 2000, Bookhardt.*

* cited by examiner

Primary Examiner—Gerald Tolin
(74) Attorney, Agent, or Firm—Birch, Stewart, Kolasch & Birch, LLP

(57) ABSTRACT

A fastening frame of the invention includes a fastener comprised of a transversal connecting arm that connects two attachment parts at two opposite sides. The transversal connecting arm has a thickness that is smaller than the space between the fins, and an edge that is parallel to the base of the heat slug. The fastening frame is thereby mounted in a manner that the transversal connecting arm inserts in a space between two fins with the attachment parts attached to the positioning socle. The transversal connecting arm is further downwardly connected to a pressing part that presses the base of the heat slug in tight abutment against the microprocessor.

13 Claims, 10 Drawing Sheets

MICROPROCESSOR-HEAT SLUG FASTENING FRAME

FIELD OF THE INVENTION

The invention relates to a fastening frame for tightly clamping a microprocessor against a heat slug and, more particularly, to such a fastening frame that allows efficient heat dissipation of the heat slug.

BACKGROUND OF THE INVENTION

The development of the electronic industry provides electronic components that process increasingly faster. This increase in the processing speed causes a higher heating of the electronic components that, if not adequately dissipated, may cause irreversible damages. To provide an adequate heat dissipation within electronic apparatuses such as computers, a fan and a heat slug are commonly mounted to dissipate the heat irradiated from the microprocessor. The heat slug is usually in contact with the microprocessor to promote the heat dissipation to the air, and the fan generates an air flow over the heat slug to promote an air circulation that dissipate the thermal flow.

To provide an optimal heat dissipation, the heat slug therefore has to tightly contact with the microprocessor to enable an optimal thermal conduction. Moreover, the heat slug should have a maximum contact area with the air to also ensure a maximum heat dissipation. To satisfy the above requirements, a fastening frame is traditionally provided to ensure a tight contact of the heat slug with the microprocessor. To enable the mount of the fastening frame, a mounting space has to be usually left on a central zone of the heat slug. The traditional fastening frame of the prior art principally includes a fastener that is parallel to the heat slug and is mounted in the mounting space of the heat slug. Two sides of the fastener are further provided with attachment parts that clamp a positioning socle on which is mounted the microprocessor. This method however has the disadvantage of requiring a necessary mounting space on the heat slug, which reduces the number of heat dissipating fins thereon. To attain a same heat dissipation performance, the size of the heat slug therefore has to be increased. Unfortunately, the available mounting space for the heat slug is limited. Moreover, the heat irradiated from microprocessor principally comes from the central zone thereof. A removal of the heat dissipating fins in the central zone of the heat slug is therefore detrimental to an optimal heat dissipation. This heat dissipation is more particularly critical for current microprocessors that are capable of processing over 2 GHz, for which if the heat irradiated from the central zone of the microprocessor is not adequately dissipated, the operation of the microprocessor is greatly affected.

SUMMARY OF THE INVENTION

Accordingly, it is therefore a principal object of the invention to provide a fastening frame that can be mounted between existing spaces between the heat dissipation fins of the heat slug without reducing its number at the central zone of the heat slug. As a result, the heat dissipation of the heat slug is improved.

To attain the above and other objectives, a fastening frame of the invention includes a fastener that is comprised of a transversal connecting arm that connects two attachment parts at two opposite sides. The transversal connecting arm has a thickness that is smaller than the space between the fins, and an edge that is parallel to the base of the heat slug. The fastening frame is thereby mounted in a manner that the transversal connecting arm inserts in a space between two fins with the attachment parts attached to the positioning socle. The transversal connecting arm is further downwardly connected to a pressing part that presses the base of the heat slug in tight abutment against the microprocessor.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings which are given by way of illustration only, and thus are not limitative of the present invention, is as follows.

DETAILED DESCRIPTION OF THE EMBODIMENTS

Figure 1:
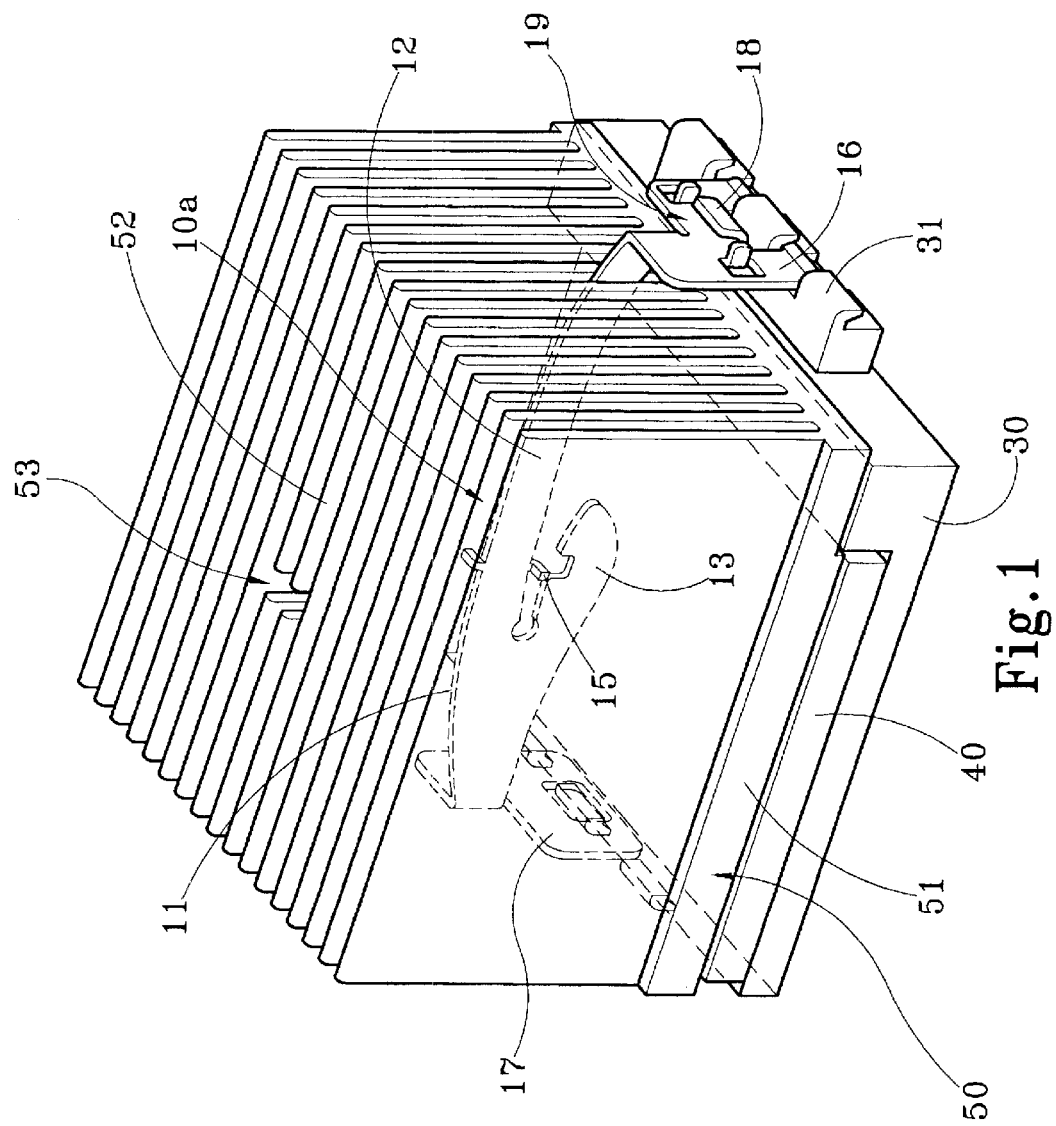
FIG. 1 is a perspective view illustrating the assembly of a fastening frame according to an embodiment of the invention.

Wherever possible in the following description, like reference numerals will refer to like elements and parts unless otherwise illustrated.

Figure 2:
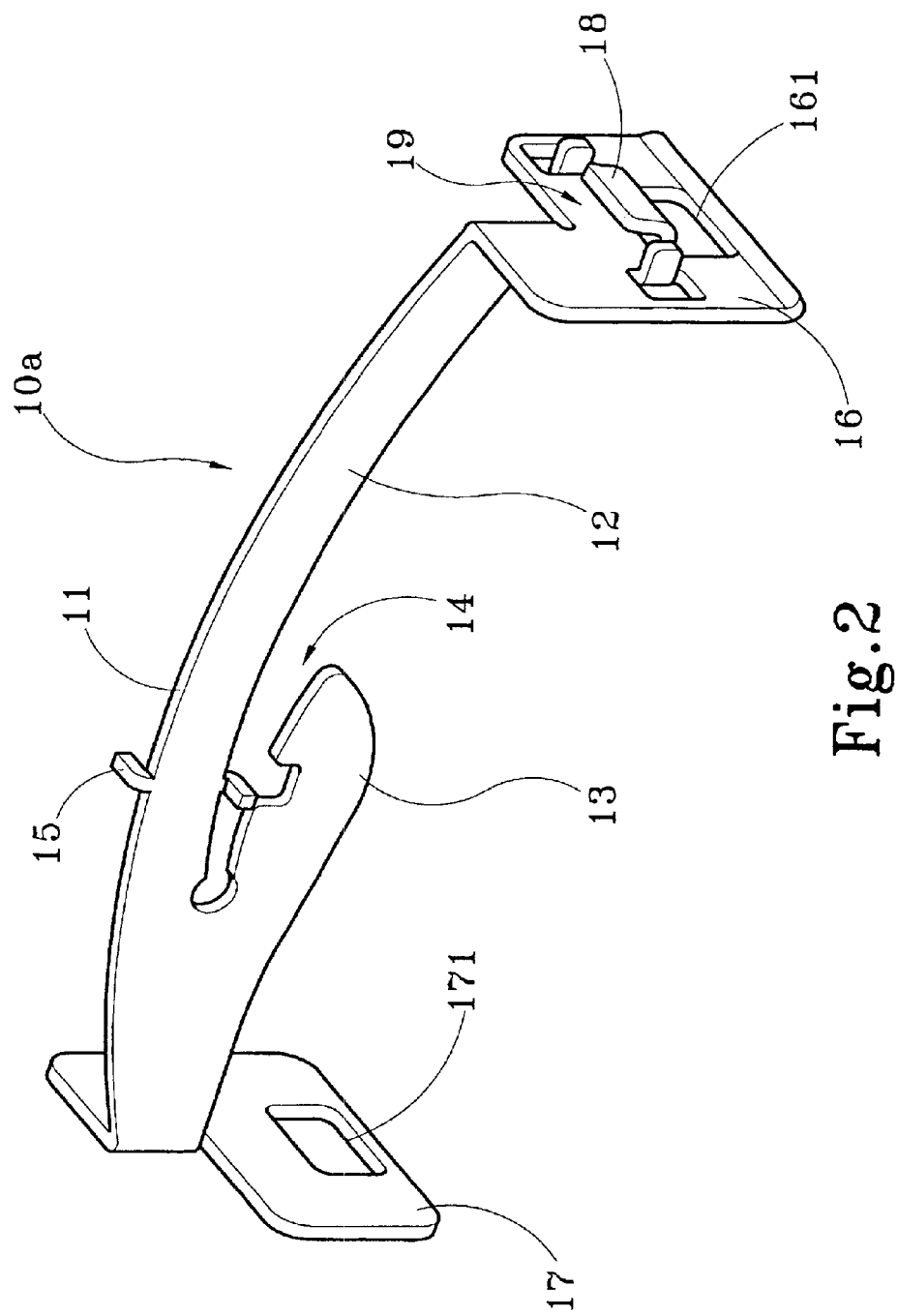
FIG. 2 is a perspective view of a fastening frame according to a first embodiment of the invention.

FIG. 1 and FIG. 2 are respectively an assembly view and a perspective view of a fastening frame according to a first embodiment of the invention. As illustrated, the fastening frame of the invention is principally directed to tightly abut a microprocessor 40 against a heat slug 50 for achieving efficient heat dissipation. The heat slug 50 is provided with a base 51 against which the microprocessor 40 is to be tightly abutted. A plurality of fins 52 spaced apart from one another are further arranged over the base 51 oppositely to the microprocessor 40. The fastening frame principally includes a fastener 10a for clamping the base 51 against the microprocessor 40. The fastener 10a terminates in two attachment parts 16, 17 at two opposite lateral sides dedicated to attach the fastening frame to the positioning socle 30. The fastener 10a further includes a transversal connecting arm 12 relatively flat that extends in a plane approximately perpendicular to the base 51 to oppositely connect the lateral attachment parts 16, 17. An edge 11 of the arm 12 is parallel to the base 51, and the thickness of the arm 12 is such that the arm 12 can be disposed in a space between the fins 52. The transversal arm 12 is further separated via a cushion opening 14 from a pressing part 13 directed to abut against the base 51, the pressing part 13 also extending in a plane approximately perpendicular to the base 51.

Figure 3A:
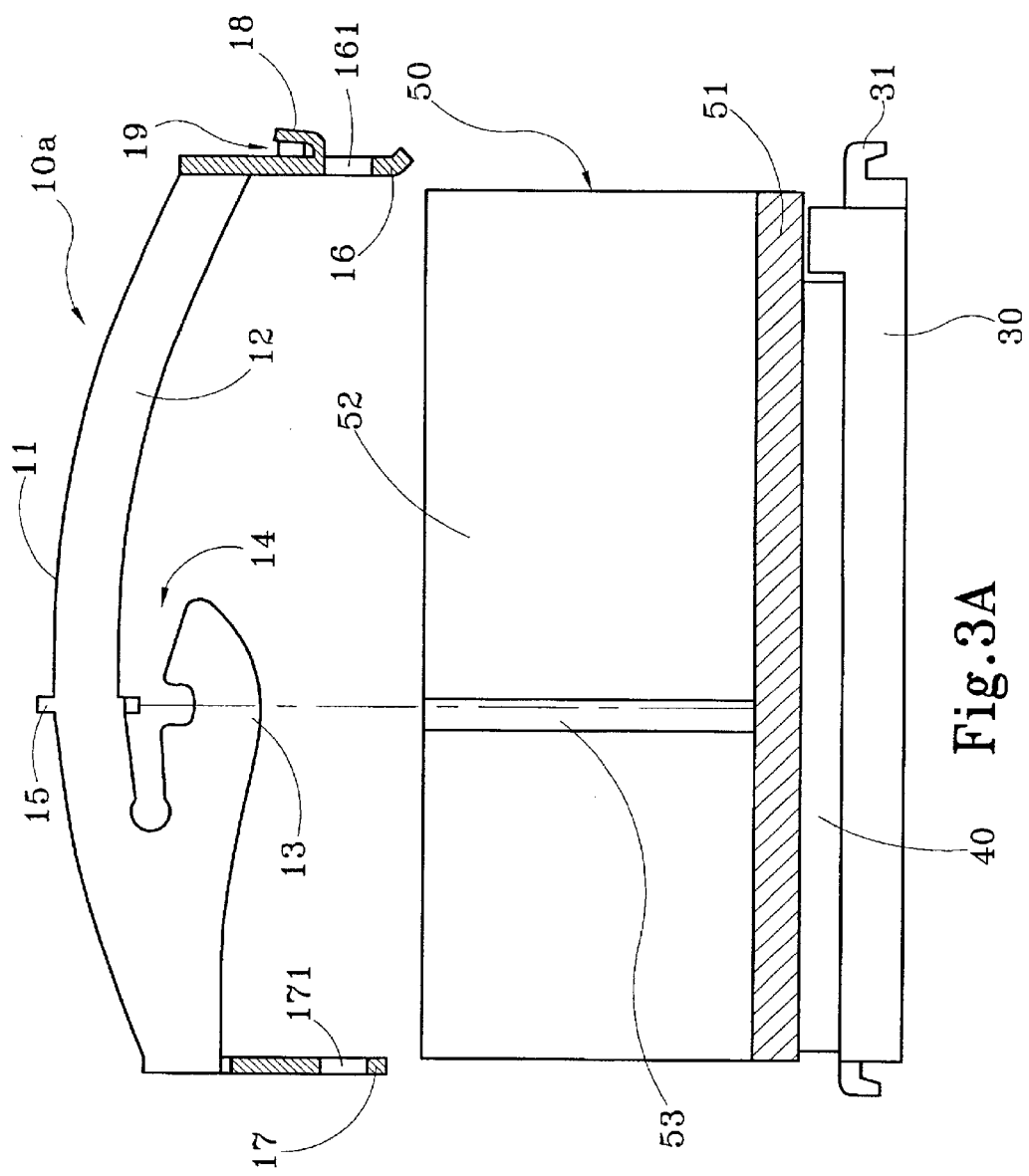
FIG. 3A, FIG. 3B, FIG. 3C are cross-sectional views illustrating the mounting operation of a fastening frame according to a first embodiment of the invention.
Figure 3B:
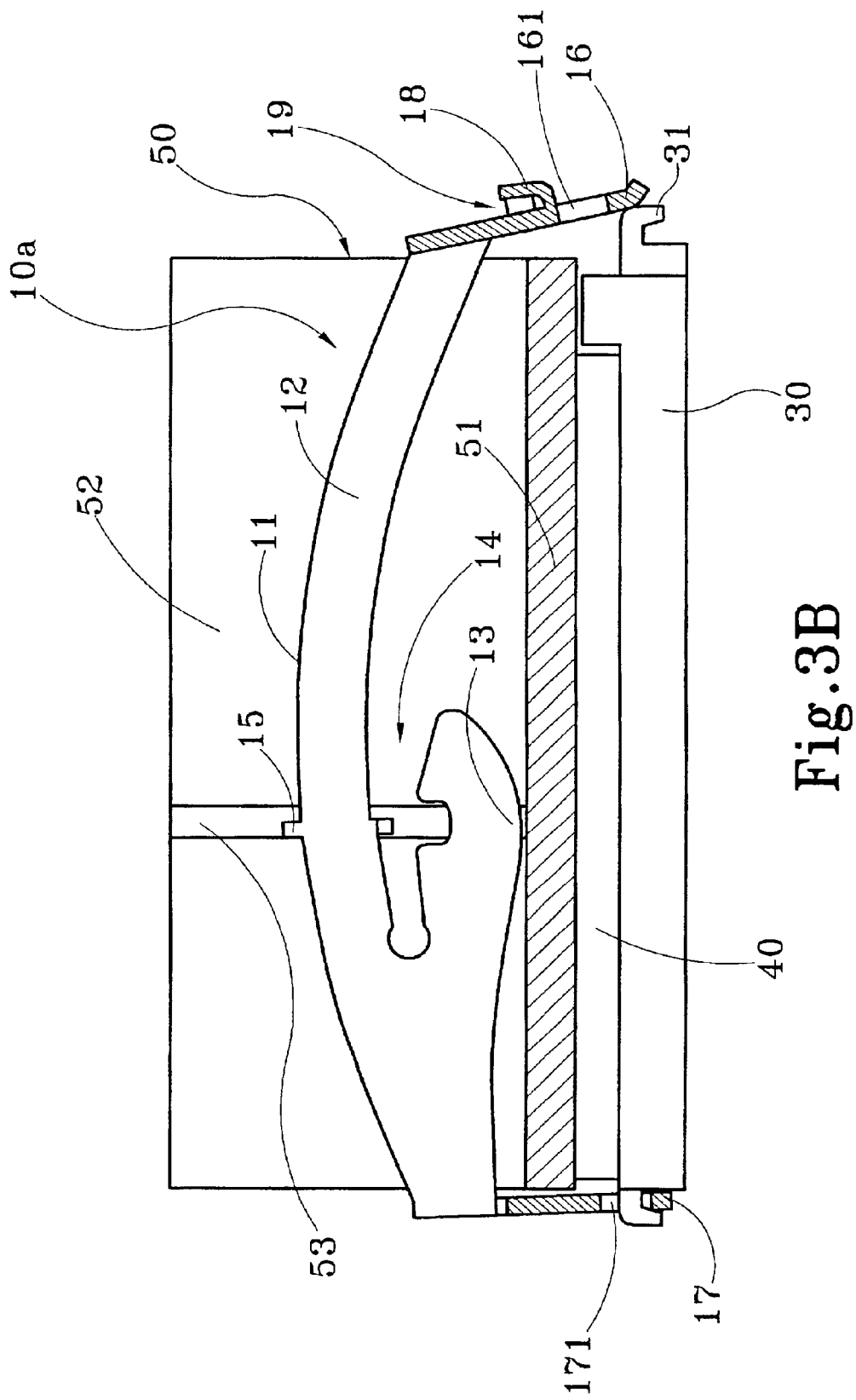

Referring to FIG. 3A, an embodiment of the fastener 10a according to the invention is fabricated in a single body that is mounted in a manner to press against a central zone of the base 51. The transversal connecting arm 12 and the pressing part 13 are formed monolithically via stamping. The attachment parts 16, 17 are monolithically connected with the fastener 10a via bending. The positioning socle 30 and the attachment parts 16, 17 are further respectively provided with engagement protrusions 31 and corresponding engagement slots 161, 171 for mutual assembly. A pressure space 19 is further defined on the attachment part 16, limited via a plurality of flanks 18. As mentioned above, because the arm 12 is parallel to the base 51 and its thickness is smaller than the separating spaces between the fins 52, the fastener 10a can be therefore disposed in a manner that the arm 12 is positioned between two fins 52. The fastener 10a is further provided with limiter projections 15 that protrude in a direction perpendicular to the arm 12 to which correspond limiter slots 53 formed through the fins 52 neighboring the location where the fastener 10a is mounted. The fastener 10a is arranged in a manner that the arm 12 is positioned in the space between two fins 52 with the limiter projections 15 inserted through the limiter slots 53 to prevent transversal move of the fastener 10a As shown in FIG. 3B, in assembly operation, the operator first engages the engagement slot 171 of the attachment part 17 with one engagement protrusion 31 of the positioning socle 30 for adequate positioning. An adequate tool such as a flat-end screwdriver then is inserted in the pressure space 19 of the attachment part 16, the tool being prevented from escaping out of the pressure space 19 via the abutment of the flanks 18. Subsequently, a torsion force is exerted on the tool to laterally draw the attachment part 16 apart from the attachment part 17 until the attachment part 16 passes over the other engagement protrusions 31. Hence, the attachment part 16 can be downwardly moved to have the engagement slot 161 engage the other engagement protrusion 31.

Figure 3C:
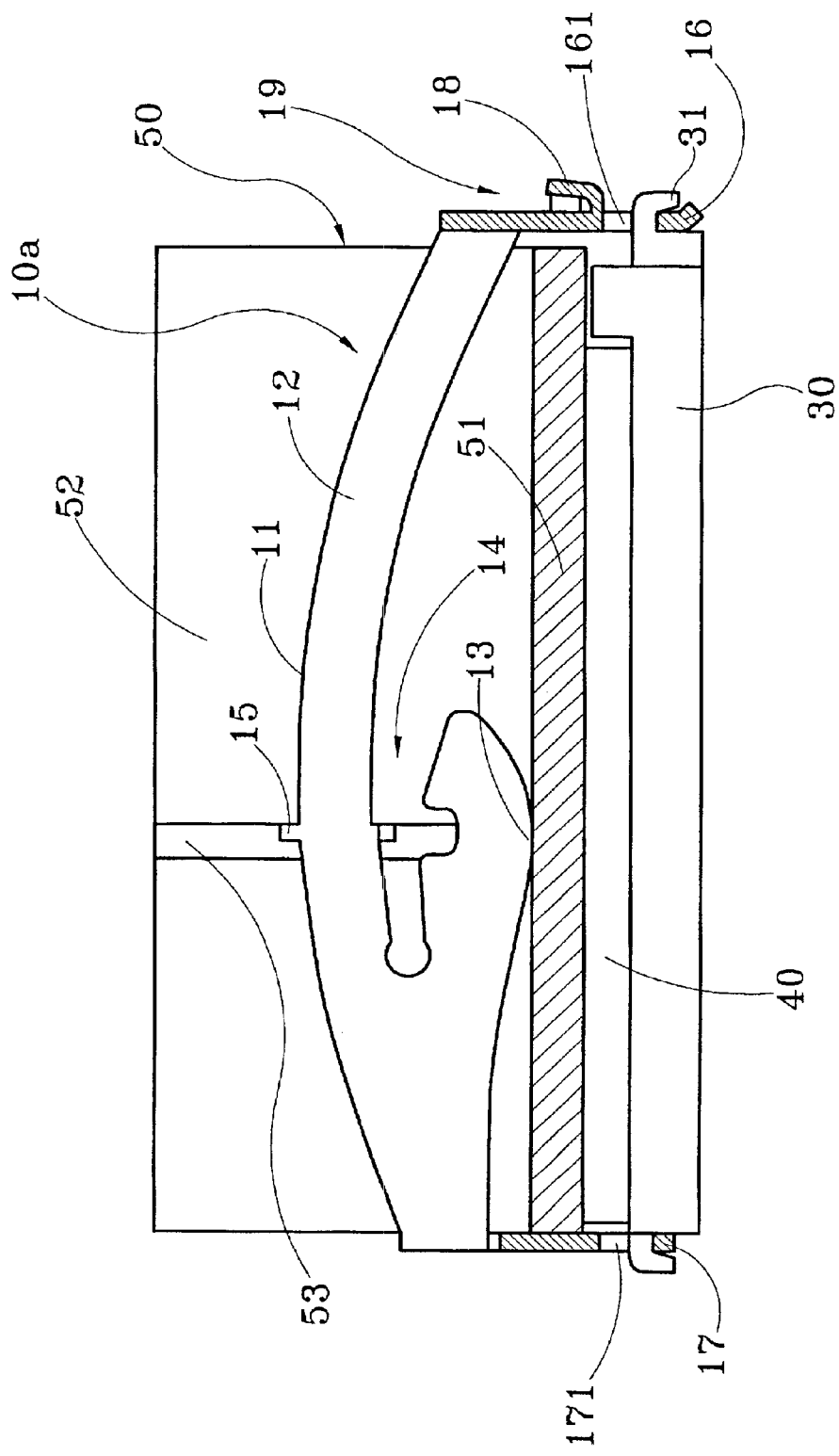

As shown in FIG. 3C, once the attachment parts 16, 17 are attached to the positioning socle 30, the pressing part 13 exerts a downward pressure against the base 51 of the heat slug 50. Via three positioning points, the heat slug 50 can be thereby securely maintained in a generally flat abutment against the microprocessor 40. As illustrated in FIG. 1 and described above, the assembly of the invention therefore allows to spare the attachment space of the fastening frame, which leaves more space for more fins to be placed. The effective heat dissipation zone of the heat slug 50 can be therefore increased. A part of the heat, principally irradiated from the central region of the microprocessor 40, is directly dissipated through the base 51 to the above fins 52, while another part is dissipated through the base 51 to peripheral fins 52. As shown experimentally, the heat dissipation with the specific assembly of the invention is higher than that of the prior art. Therefore, with a same standard of heat slug, the invention allows to the heat dissipation.

Figure 4:
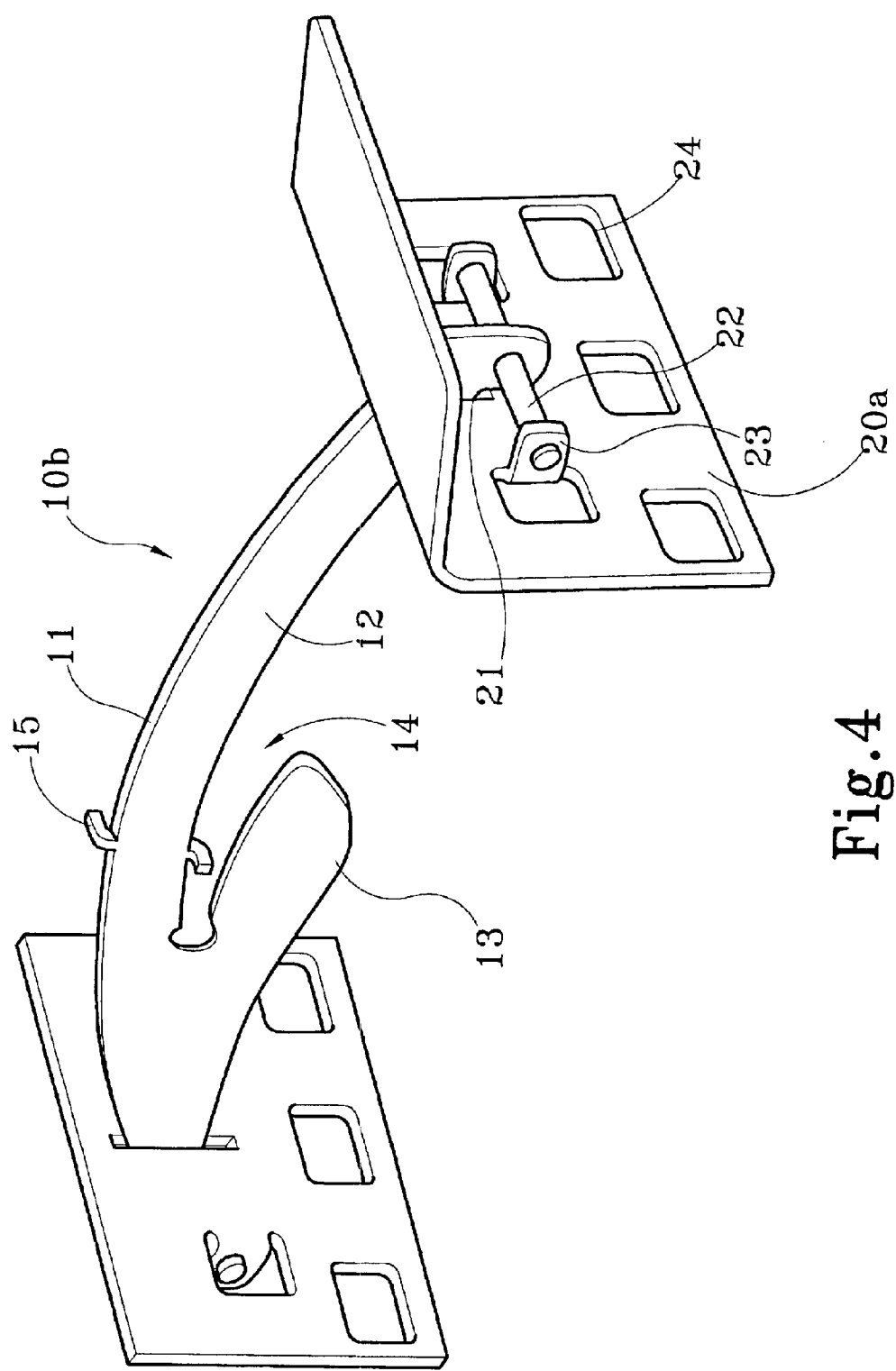
FIG. 4 is a perspective view of a fastening frame according to a second embodiment of the invention.

Referring now to FIG. 4, a perspective view schematically illustrates a second embodiment of the invention. As illustrated, the fastener 10b of this embodiment is fabricated in a single body that is mounted in a manner to press against a central zone of the base 51. The transversal connecting arm 12 and the pressing part 13 are formed monolithically via stamping. Two opposite lateral attachment parts 20a are further provided with connecting slots 21 through which two opposite ends of the transversal connecting arm 12 insert. A rod 22 passes respectively through each inserted end of the arm 12 and connecting flanges 23 of the attachment parts 20a to connect the arm 12 to the attachment parts 20a. Three sets of engagement protrusions 31 and corresponding engagement slots 24 are respectively formed on the base 30 and the attachment parts 20a. The assembly of the fastener 10b with the base 30 is achieved via rotatably adjusting, by means of the pivot of the rod 22, the adequate width between the attachment parts 20a with respect to the engagement protrusions 31 in order to engage the protrusions 31 with the slots 24.

Figure 5:
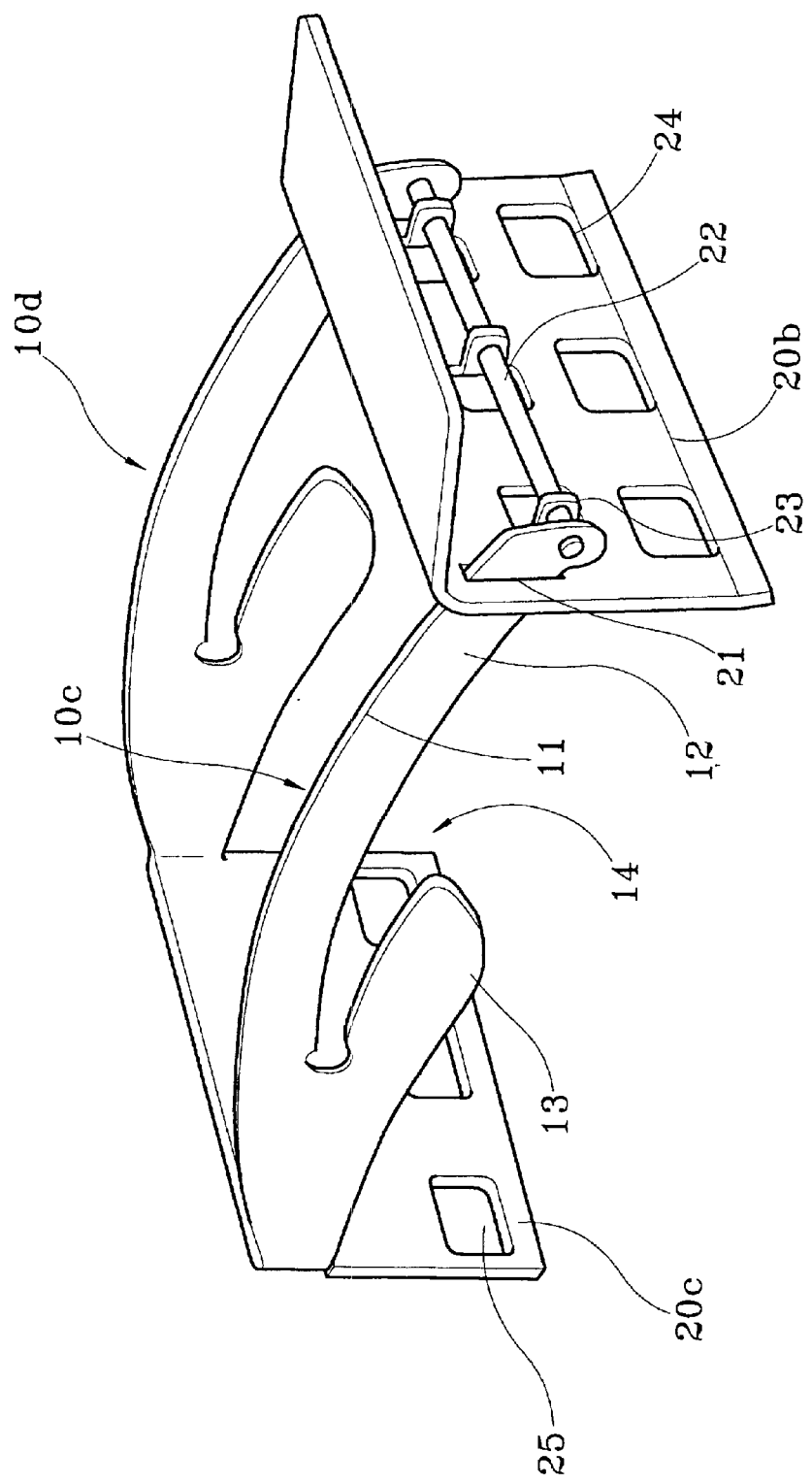
FIG. 5 is a perspective view of a fastening frame according to a third embodiment of the invention.

Referring now to FIG. 5, a perspective view schematically illustrates a third embodiment of the invention. In this embodiment, the fastening frame is comprised of two fasteners 10c, 10d, formed in two bodies, which are mounted in a manner to press against two sides of the base 51. One attachment part 20c is monolithically connected to the fasteners 10c, 10d in a bending manner. Another opposite attachment part 20b is provided with a connecting slot 21 through which an end of the transversal connecting arm 12 inserts. A rod 22 passes respectively through the inserted end of the arm 12 and connecting flanges 23 of the attachment part 20b to connect the arm 12 to the attachment part 20b. Furthermore, engagement protrusions 31 and corresponding engagement slots 24, 25 are respectively formed on the base 30 and the attachment parts 20b, 20c.

The variation between the above-described three embodiments principally lies their different structures of attachment parts 16, 17, 20a, 20b, 20c, their respective purpose and assembly being substantially similar.

Figure 6:
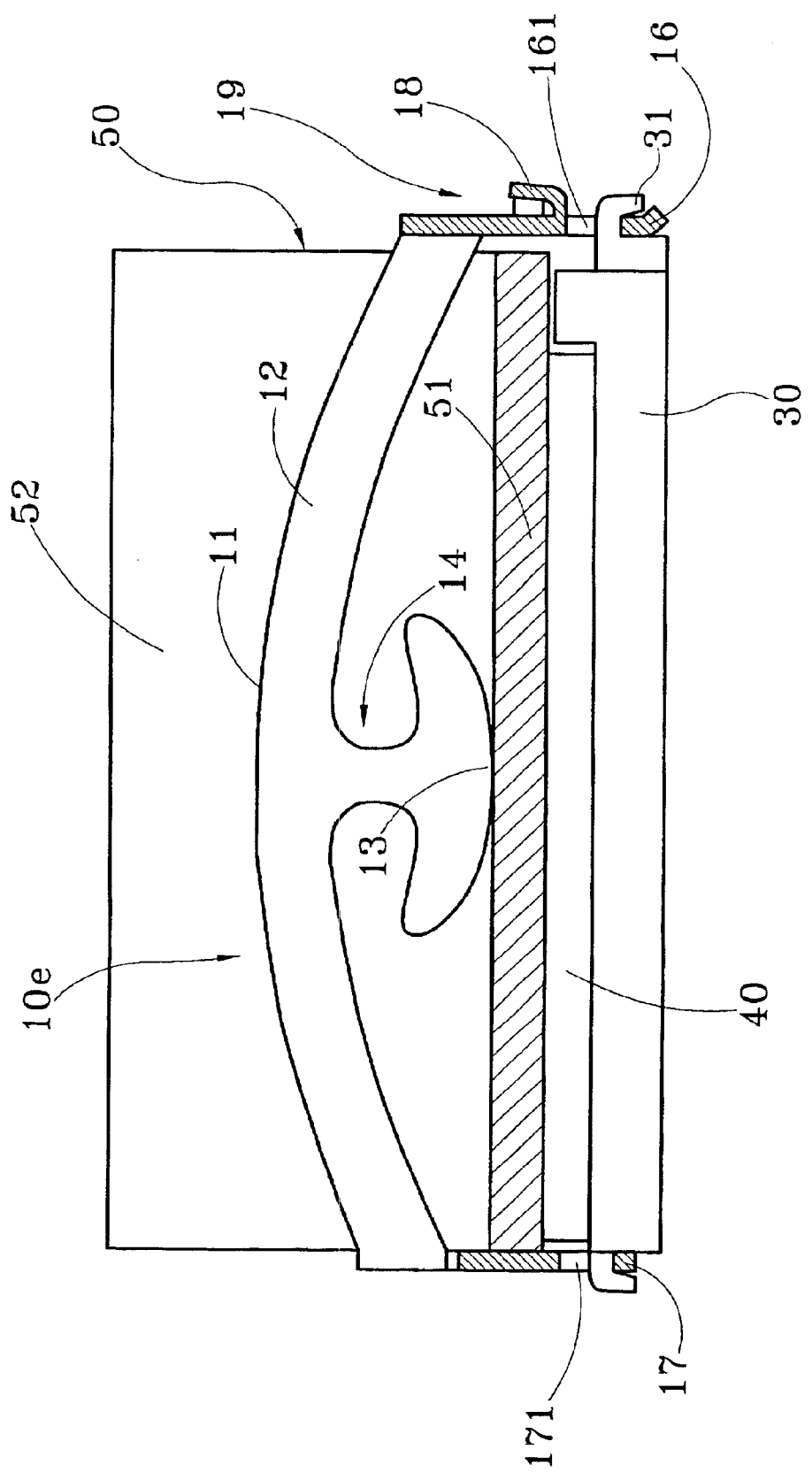
FIG. 6 is a cross-sectional view illustrating a fastening frame according to a fourth embodiment of the invention.
Figure 7:
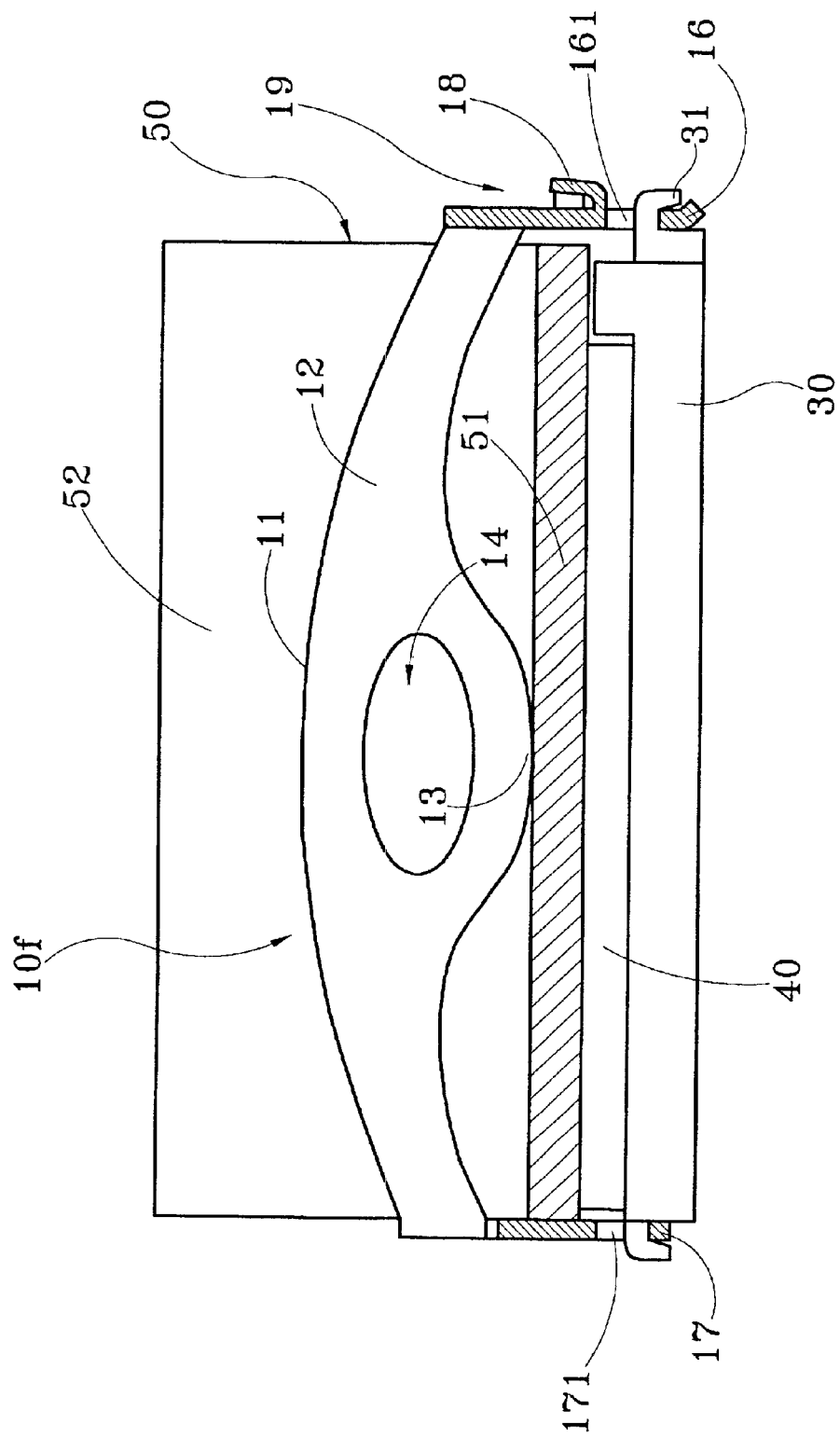
FIG. 7 is a cross-sectional view illustrating a fastening frame according to a fifth embodiment of the invention.
Figure 8:
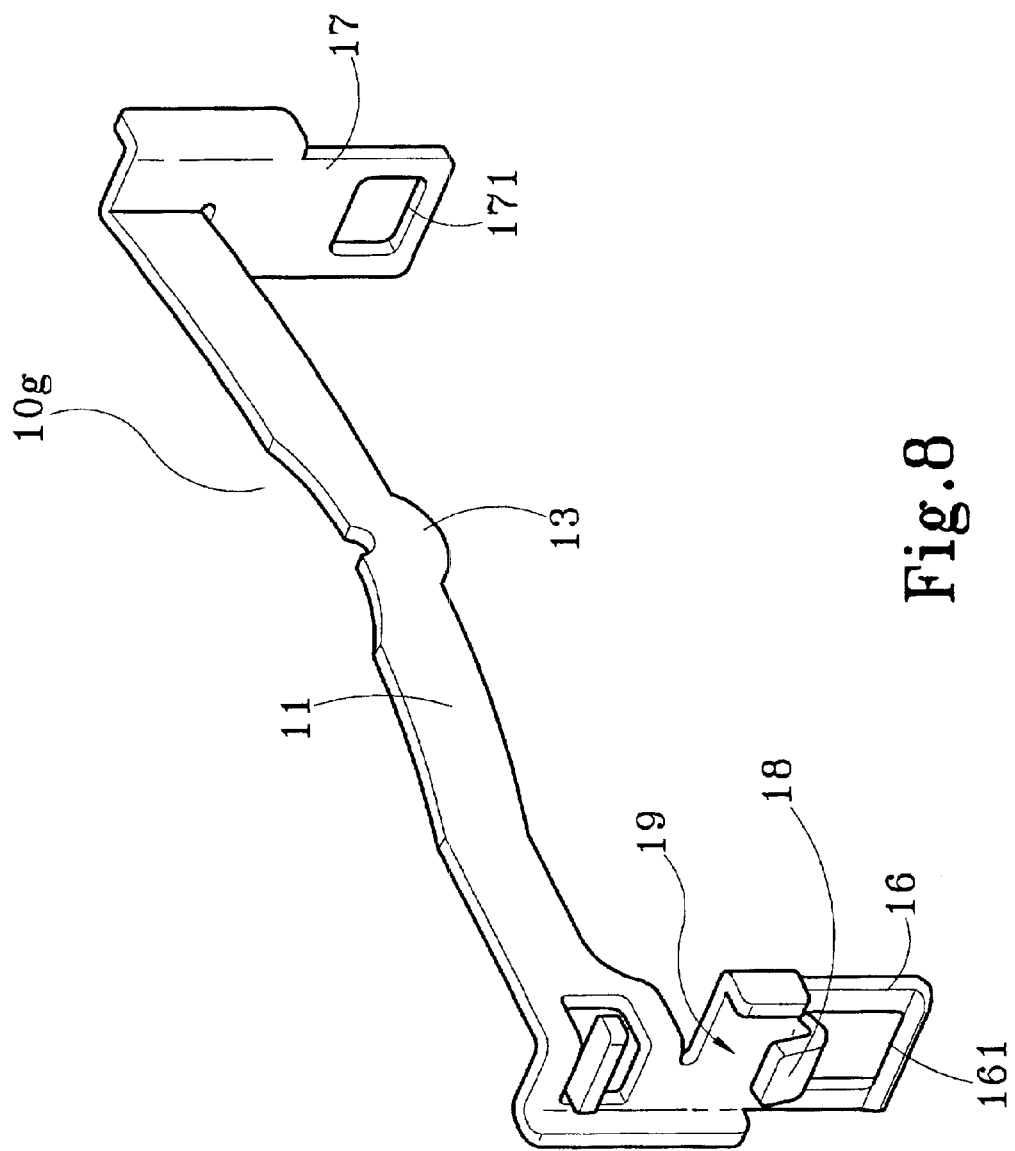
FIG. 8 is a cross-sectional view illustrating a fastening frame according to a sixth embodiment of the invention.

Referring to FIG. 6, FIG. 7, and FIG. 8, various schematic views illustrate fourth, fifth, and sixth embodiments of the invention. These various embodiments show that the fasteners 10e, 10f, 10g of the fastening frame can have different configurations. Besides the difference of shape between fastener of FIG. 2 and that of FIG. 5, other variations of shape may be envisaged such as illustrated FIG. 6, FIG. 7, and FIG. 8. Those different structures of fasteners are similarly achieved via stamping to form a transversal connecting arm 12 and a pressing part 13.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A heat slug-microprocessor fastening frame, used to tightly abut the heat slug against the microprocessor to achieve an effective heat dissipation, wherein the microprocessor is mounted on a positioning socle, the heat slug is comprised of a base against which is abutted the microprocessor, and the base oppositely to the microprocessor is further provided with a plurality of fins spaced apart from one another, the fastening frame principally includes at least a fastener connectable to the base, two opposite lateral sides of the fastener being provided with two attachment parts for attachment to the positioning socle, the fastening frame comprising:

the fastener having a transversal connecting arm that extends in a plane approximately perpendicular to the base and connects the attachment parts, wherein the arm is provided with a pressing part that presses against the base, an edge of the arm is parallel to the base, and the thickness of the arm is such that the arm can be disposed in a space between the fins; and wherein the attachment parts are respectively provided with a plurality of connecting flanges and a connecting slot through which an end portion of the transversal connecting arm inserts, a rod passing through the inserted end portion of the transversal connecting arm and the connecting flanges to connect the arm to the attachment parts, a plurality of engagement protrusions and corresponding engagement slots engaging ith one another being further formed on the positioning socle and the attachment parts.

2. The frame of claim 1, wherein the fastener is comprised of a single body that presses against a central zone of the base.

3. The frame of claim 1, wherein the fastener is comprised of two bodies that press against two sides of the base.

4. The frame of claim 1, wherein the fastener is further provided with at least a limiter projection that engages through at least a corresponding limiter slot formed through the fins.

5. The frame of claim 1, wherein the attachment parts are monolithically formed in the fastener via bending, the positioning socle and the attachment parts being provided with engagement protrusions and corresponding engagement slots that engage with one another, a pressure space being further defined on one of the attachment parts by flanks.

6. The frame of claim 1, wherein the transversal connecting arm and the pressing part are formed in a single body via stamping.

7. The frame of claim 1, wherein one of the attachment parts is monolithically formed within the fastener via bending, while the other attachment part is provided with a plurality of connecting flanges and a connecting slot through which an end portion of the transversal connecting arm inserts, a rod passing through the inserted end portion of the transversal connecting arm and the connecting flanges to connect the arm to said other attachment part, a plurality of engagement protrusions and corresponding engagement slots engaging with one another being further formed on the positioning socle and the attachment parts.

8. A heat slug-microprocessor fastening frame, used to tightly abut the heat slug against the microprocessor to achieve an effective heat dissipation, wherein the microprocessor is mounted on a positioning socle, the heat slug is comprised of a base against which is abutted the microprocessor, and the base oppositely to the microprocessor is further provided with a plurality of fins spaced apart from one another, the fastening frame principally includes at least a fastener connectable to the base, two opposite lateral sides of the fastener being provided with two attachment parts for attachment to the positioning socle, the fastening frame comprising:

the fastener having a transversal connecting arm that extends in a plane approximately perpendicular to the base and connects the attachment parts, wherein the arm is provided with a pressing part that presses against the base, an edge of the arm is parallel to the base, and the thickness of the arm is such that the arm can be disposed in a space between the fins; and wherein one of the attachment parts is monolithically formed within the fastener via bending, while the other attachment part is provided with a plurality of connecting flanges and a connecting slot through which an end portion of the transversal connecting arm inserts, a rod passing through the inserted end portion of the transversal connecting arm and the connecting flanges to connect the arm to said other attachment part, a plurality of engagement protrusions and corresponding engagement slots engaging with one another being further formed on the positioning socle and the attachment parts.

9. The frame of claim 8, wherein the fastener is comprised of a single body that presses against a central zone of the base.

10. The frame of claim 8, wherein the fastener is comprised of two bodies that press against two sides of the base.

11. The frame of claim 8, wherein the fastener is further provided with at least a limiter projection that engages through at least a corresponding limiter slot formed through the fins.

12. The frame of claim 8, wherein the attachment parts are monolithically formed in the fastener via bending, the positioning socle and the attachment parts being provided with engagement protrusions and corresponding engagement slots that engage with one another, a pressure space being further defined on one of the attachment parts by flanks.

13. The frame of claim 8, wherein the transversal connecting arm and the pressing part are formed in a single body via stamping.

* * * * *